United States Patent
Lee et al.

(10) Patent No.: US 10,824,507 B2
(45) Date of Patent: Nov. 3, 2020

(54) SEMICONDUCTOR MEMORY DEVICE, CONTROLLER, AND MEMORY SYSTEM

(71) Applicant: Samsung Electronics Co., Ltd., Suwon-si (KR)

(72) Inventors: Myung Kyu Lee, Seoul (KR); Jun Jin Kong, Yongin-si (KR); Ki Jun Lee, Seoul (KR); Sung Hye Cho, Hwaseong-si (KR); Dae Hyun Kim, Suwon-si (KR); Yong Gyu Chu, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 19 days.

(21) Appl. No.: 16/372,047

(22) Filed: Apr. 1, 2019

(65) Prior Publication Data

US 2020/0133768 A1  Apr. 30, 2020

(30) Foreign Application Priority Data

Oct. 24, 2018  (KR) .......................... 10-2018-0127276
Nov. 6, 2018  (KR) .......................... 10-2018-0134888

(51) Int. Cl.
G06F 11/10 (2006.01)
H03M 13/29 (2006.01)
G11C 29/52 (2006.01)

(52) U.S. Cl.
CPC .......... *G06F 11/1068* (2013.01); *G11C 29/52* (2013.01); *H03M 13/2906* (2013.01)

(58) Field of Classification Search
CPC ........... G06F 11/1068; H03M 13/2906; H03M 13/3707; G11C 29/52; G11C 2029/0411
See application file for complete search history.

(56) References Cited

U.S. PATENT DOCUMENTS 6,822,913 B2  11/2004  Pochmuller
7,184,351 B2  2/2007  Ito et al.
(Continued)

FOREIGN PATENT DOCUMENTS

JP  07-083275  3/1995
KR  2017-0028160 A  3/2017

OTHER PUBLICATIONS

S. Ning et al., "Reset-Check-Reverse-Flag Scheme on NRAM With 50% Bit Error Rate or 35% Parity Overhead and 16% Decoding Latency Reductions for Read-Intensive Storage Class Memory," in IEEE Journal of Solid-State Circuits, vol. 51, No. 8, pp. 1938-1951, Aug. 2016. (Year: 2016).*

(Continued)

*Primary Examiner* — Cynthia Britt
(74) *Attorney, Agent, or Firm* — Muir Patent Law, PLLC

(57) ABSTRACT

Disclosed are a semiconductor memory device, a controller, and a memory system. The semiconductor memory device includes a memory cell array including a plurality of memory cells, and an error correcting code (ECC) decoder configured to receive first data and a parity output from selected memory cells of the memory cell array. The ECC decoder generates a syndrome based on the first data and the parity, generates a decoding status flag (DSF) indicating a type of an error of the first data by the syndrome, and outputs the second data and the DSF to an external device outside of the semiconductor memory device when a read operation of the semiconductor memory device is performed.

20 Claims, 8 Drawing Sheets

(56) References Cited

U.S. PATENT DOCUMENTS

| | | | |
|---|---|---|---|
| 8,271,862 B2 | 9/2012 | Kobayashi | |
| 8,386,868 B2 | 2/2013 | Lasser | |
| 8,739,004 B2 | 5/2014 | Olcay et al. | |
| 8,869,000 B2 * | 10/2014 | Varnica | H03M 13/29 |
| | | | 714/755 |
| 9,235,466 B2 * | 1/2016 | Sohn | G06F 11/10 |
| 9,786,387 B2 * | 10/2017 | Cha | G11C 29/52 |
| 10,127,102 B2 * | 11/2018 | Ryu | G06F 11/1048 |
| 2017/0070240 A1 | 3/2017 | Kim | |
| 2020/0159617 A1 * | 5/2020 | Cha | G06F 11/1068 |

OTHER PUBLICATIONS

Y. Hu, S. Song, S. Xiao, Q. Xu, N. Xiao and Z. Qin, "A Dominating Error Region Strategy for Improving the Bit-Flipping LDPC Decoder of SSDs," in IEEE Transactions on Circuits and Systems II: Express Briefs, vol. 62, No. 6, pp. 578-582, Jun. 2015. (Year: 2015).*

* cited by examiner

FIG. 2

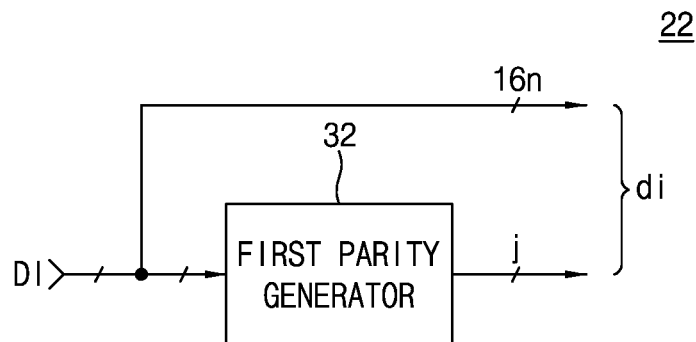

FIG. 3

$$H \cdot R = \begin{pmatrix} & C1 & C2 & \cdots & C128 & C129 & C130 & \cdots & C136 \\ R1 & h11 & h12 & \cdots & h1128 & 1 & 0 & \cdots & 0 \\ R2 & h21 & h22 & \cdots & h2128 & 0 & 1 & \cdots & 0 \\ & \cdot & \cdot & & \cdot & \cdot & \cdot & & \cdot \\ & \cdot & \cdot & & \cdot & \cdot & \cdot & & \cdot \\ & \cdot & \cdot & & \cdot & \cdot & \cdot & & \cdot \\ R8 & h81 & h82 & \cdots & h8128 & 0 & 0 & \cdots & 1 \end{pmatrix} \begin{pmatrix} r1 \\ r2 \\ \cdot \\ \cdot \\ \cdot \\ r128 \\ P21 \\ P22 \\ \cdot \\ \cdot \\ P28 \end{pmatrix} = \begin{pmatrix} 0 \\ 0 \\ \cdot \\ \cdot \\ \cdot \\ 0 \end{pmatrix}$$

FIG. 5

$$H' \cdot R' = \begin{pmatrix} & C1' & C2' & \cdots & C136' \\ R1' & h11' & h12' & \cdots & h1136' \\ R2' & h21' & h22' & \cdots & h2136' \\ & \cdot & \cdot & \cdot & \cdot \\ & \cdot & \cdot & \cdot & \cdot \\ & \cdot & \cdot & \cdot & \cdot \\ R8' & h81' & h82' & \cdots & h8136' \end{pmatrix} \begin{pmatrix} r1' \\ r2' \\ \cdot \\ \cdot \\ \cdot \\ r128' \\ P1' \\ P2' \\ \cdot \\ \cdot \\ P8' \end{pmatrix} = \begin{pmatrix} S1 \\ S2 \\ \cdot \\ \cdot \\ \cdot \\ S8 \end{pmatrix}$$

FIG. 6

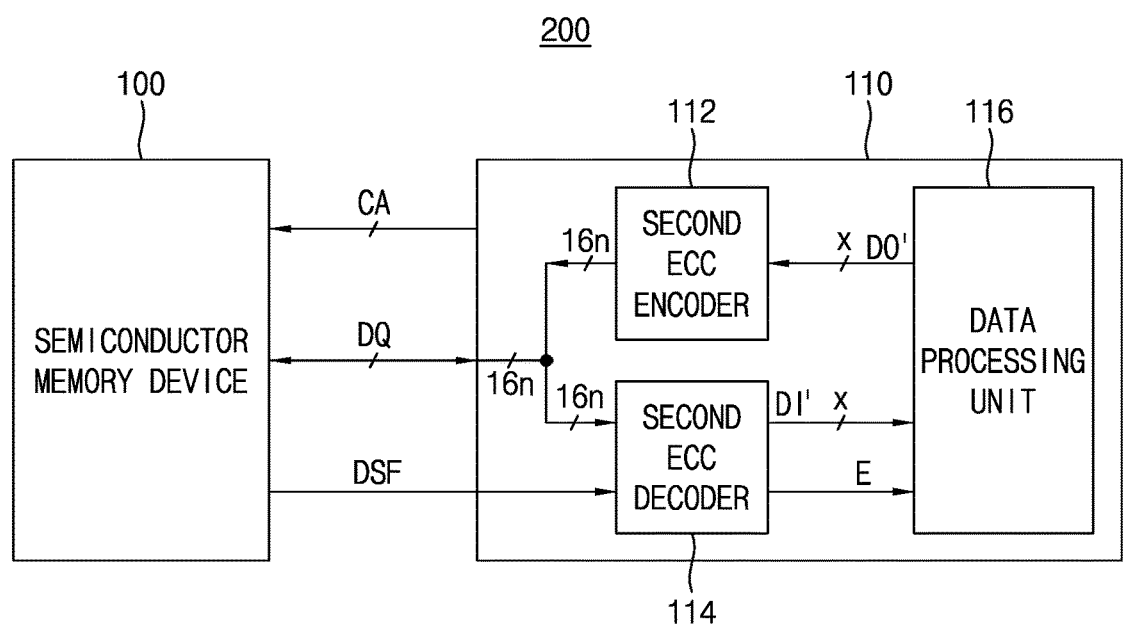

SEMICONDUCTOR MEMORY DEVICE, CONTROLLER, AND MEMORY SYSTEM

CROSS-REFERENCE TO RELATED APPLICATION

This application claims priority under 35 U.S.C. § 119 to Korean Patent Application No. 10-2018-0127276, filed on Oct. 24, 2018, and Korean Patent Application No. 10-2018-0134888, filed on Nov. 6, 2018, the disclosure of each of which is incorporated herein by reference in its entirety.

BACKGROUND

1. Field

Devices, controllers, and systems consistent with example embodiments relate to a semiconductor memory device, a controller, and a memory system.

2. Description of Related Art

A memory system may include a semiconductor memory device and a controller. Generally, each of a semiconductor memory device and a controller may perform a predetermined error correcting code (ECC) decoding operation. For example, the semiconductor memory device may perform a 1-bit error detection and 1-bit error correction operation and the controller may perform only a 3-bit error detection operation or only a 1-bit error correction and 2-bit error detection operation. However, it is desired that the controller performs a different ECC decoding operation according to a type of an error.

SUMMARY

The example embodiments of the inventive concept are directed to providing a semiconductor memory device, a controller, and a memory system capable of generating a decoding status flag (DSF) according to a type of an error and selectively performing a different error correction code decoding operation on the basis of the decoding status flag.

The scope of the inventive concept is not limited to the above-described object, and other unmentioned objects may be clearly understood by those skilled in the art from the following descriptions.

According to example embodiments, there is provided a semiconductor memory device which includes a row decoder configured to decode a row address to generate a word line selection signal, a column decoder configured to decode a column address to generate a column selection signal, a memory cell array including a plurality of memory cells, one or more memory cells are selected in response to the word line selection signal and the column selection signal, and an error correcting code (ECC) decoder configured to receive first data and a parity output from selected memory cells of the memory cell array and generate a syndrome based on the first data and the parity. In response to a read operation of the semiconductor memory device being performed, the ECC decoder generates second data and a decoding status flag (DSF) indicating a type of an error of the first data by the syndrome and outputs the second data and the DSF to an external device outside of the semiconductor memory device. A number of bits of the first data may be the same as a number of bits of the second data.

According to example embodiments, there is provided a controller which includes an ECC decoder configured to perform an ECC decoding operation selected from among a plurality of ECC decoding operations on first data applied from an external device outside of the controller in response to a decoding status flag (DSF) applied from the external device and indicating a type of an error of the first data and generate second data and an error signal by performing the selected ECC decoding operation.

According to example embodiments, there is provided a memory system which includes a semiconductor memory device including a row decoder configured to decode a row address to generate a word line selection signal, a column decoder configured to decode a column address to generate a column selection signal, a memory cell array including a plurality of memory cells, one or more memory cells are selected in response to the word line selection signal and the column selection signal, and including a first ECC decoder configured to perform a first ECC decoding operation by receiving first data and a parity output from selected memory cells of the memory cell array, to generate a syndrome based on the first data and the parity, to generate second data by performing the first ECC decoding operation, and to generate a decoding status flag (DSF) indicating a type of an error of the first data by the syndrome when a read operation of the semiconductor memory device is performed. The memory system further includes a controller configured to control the semiconductor memory device. The controller includes a second ECC decoder configured to perform an ECC decoding operation selected from among a plurality of ECC decoding operations on the second data applied from the semiconductor memory device in response to the DSF applied from the semiconductor memory device.

BRIEF DESCRIPTION OF THE DRAWINGS

FIG. 2 is a diagram showing an error correcting code (ECC) encoder according to an example embodiment of the inventive concept.

FIG. 3 is a diagram for describing a parity operation of a first parity generator according to an example embodiment of the inventive concept.

FIG. 5 is a diagram for describing a syndrome operation of a first syndrome generator according to an example embodiment of the inventive concept.

FIG. 6 is a block diagram showing a memory system according to an example embodiment of the inventive concept.

DETAILED DESCRIPTION

Hereinafter, a semiconductor memory device, a controller, and a memory system according to example embodiments of the inventive concept will be described with reference to the accompanying drawings.

Figure 1:
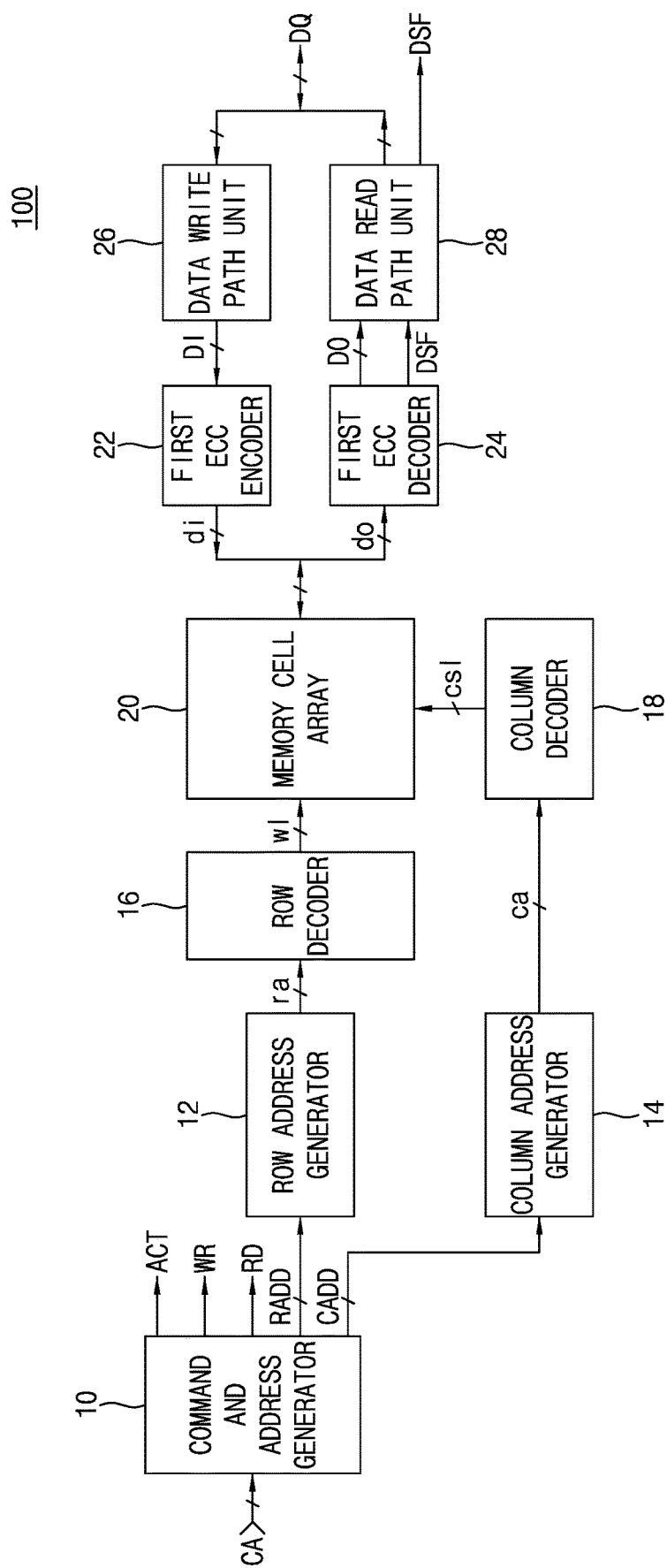
FIG. 1 is a block diagram of a semiconductor memory device according to an example embodiment of the inventive concept.

FIG. 1 is a block diagram of a semiconductor memory device according to an example embodiment of the inventive concept, and a semiconductor memory device 100 may include a command and address generator 10, a row address generator 12, a column address generator 14, a row decoder 16, a column decoder 18, a memory cell array 20, a first error correcting code (ECC) encoder 22, a first ECC decoder 24, a data write path unit 26, and a data read path unit 28. As used herein, a "unit" and a "block" may be implemented by a circuit, such as part of an integrated circuit of the semiconductor memory device.

A function of each of the blocks shown in FIG. 1 will be described as follows.

The command and address generator 10 may decode a command signal included in a command and address CA to generate an active command ACT, a write command WR, or a read command RD and may generate a row address RADD or a column address CADD from an address signal included in the command and address CA. The row address RADD may be generated together with the active command ACT, and the column address CADD may be generated together with the write command WR or the read command RD.

The row address generator 12 may receive the row address RADD to generate a row address signal ra.

The column address generator 14 may receive the column address CADD to generate a column address signal ca.

The row decoder 16 may decode the row address signal ra to generate a plurality of word line selection signals wl.

The column decoder 18 may decode the column address signal ca to generate a plurality of column selection signals csl.

The memory cell array 20 may include a plurality of memory cells (not shown), store data and parity of data di in memory cells which are selected by one of the plurality of word line selection signals wl and one of the plurality of column selection signals csl when a write operation is performed in response to the write command WR, and output data and parity of data do from selected memory cells when a read operation is performed in response to the read command RD. For example, the memory cell array 20 may store or output 16n-bit data and j-bit parity of data di or data do. Here, each of n and j is a natural number equal to or greater than 1. In example embodiments, a number of bits of the 16n-bit data may be variable such as bits of 4n-bit, bits of 8n-bit, bits of 32n-bit, etc.

The first ECC encoder 22 may receive data DI to generate a parity of the data DI and output the data and the parity as data di. For example, the first ECC encoder 22 may generate 16n-bit data and j-bit parity for the 16n-bit data as the data di. As an example, the 16n-bit data DI may include x-bit data and y-bit parity. As another example, the 16n-bit data DI may include x-bit data, y-bit parity and z-bit dummy data.

The first ECC decoder 24 may receive data do including 16n-bit data and j-bit parity from selected memory cells to generate a syndrome and generate a decoding status flag (DSF) on the basis of a type of an error using the syndrome. For example, the number of bits of the syndrome may be predetermined as the parity. For example, a number of bits of the data di may be equal to the number of bits of the data do. Here, the type of an error may be a non-error NE, a correctable error CE, or an uncorrectable error UE. As used herein, "non-error" indicates that data has no error bit. For example, the first ECC decoder 24 may generate a DSF by setting the DSF to "0" in the case of the non-error NE or the correctable error CE and setting the DSF to "1" in the case of the uncorrectable error UE. The first ECC decoder 24 may generate 16n-bit data of data DO and a 1-bit DSF in series or in parallel. The first ECC decoder 24 may correct an error included in the 16n-bit data and the j-bit parity of the data do and generate the 16n-bit data of data DO and the DSF of "0" in the case of the correctable error CE, for example, a 1-bit error.

The semiconductor memory device 100 may include an ECC engine (or, an ECC circuit) configured to perform an ECC decoding operation and an ECC encoding operation. The ECC engine may include the first ECC encoder 22 and the first ECC decoder 24.

The data write path unit 26 may sequentially receive data DQ in series and output the data DQ as data DI in parallel. For example, the data write path unit 26 may receive n-bit data 16 times in series to generate 16n-bit data. The data write path unit 26 may receive data DQ and output the data DQ as data DI when the semiconductor memory device 100 performs a write operation.

The data read path unit 28 may receive data DO and sequentially output the data DO in series. For example, the data read path unit 28 may receive 16n-bit data in parallel to output the n-bit data 16 times in series. Further, the data read path unit 28 may transmit a 1-bit DSF in series through one among data terminals (not shown) for transmitting n-bit data, or transmit the 1-bit DSF in parallel to n-bit data through a separate terminal (not shown). In other example, the data read path unit 28 may transmit at least two-bit DSF. The data read path unit 28 may receive data DO and output the data DO as the data DQ when the semiconductor memory device 100 performs a read operation.

Although not shown, the semiconductor memory device 100 according to example embodiments of the inventive concept may have a burst length (BL) set to 16 and sequentially receive or output the n-bit data 16 times in series through n data terminals (not shown).

FIG. 2 is a diagram showing the first ECC encoder 22 according to the example embodiment of the inventive concept, and the first ECC encoder 22 may include a first parity generator 32.

Referring to FIG. 2, the first parity generator 32 may receive the data DI applied from the data write path unit 26 to generate data and parity of the data di. For example, the first parity generator 32 may generate j-bit parity using a first H matrix and the 16n-bit data.

FIG. 3 is a diagram for describing a parity operation of the first parity generator 32 according to the example embodiment of the inventive concept, which is for describing the parity operation in the case in which each of n and j is eight.

Referring to FIG. 3, a first H matrix H may be an 8×136 matrix, and a matrix R of 128-bit data and 8-bit first parity may be a 136×1 matrix. In the first H matrix H, codes (h11 to h81, h12 to h82, . . . , and h1128 to h8128, 10 . . . 0, 01 . . . 0, . . . , and 00 . . . 1) of 136 column vectors C1 to C136 may have different codes including "0" and "1" except for a code including all "0." Further, for the first H matrix H, a total of $2^{128}$ different codes including the codes (h11 to h1128, h21 to h2128, . . . , and h81 to h8128) of row vectors R1 to R8 may be generated, and the same or different 8-bit parity for each of the $2^{128}$ codes in total may be generated. In this case, a minimum Hamming distance (dmin) between any two codes of the $2^{128}$ different 136-bit codes in total may be three.

Referring to FIGS. 2 and 3, the first parity generator 32 may perform an exclusive OR (XOR) operation on each of the codes (h11 to h1128, h21 to h2128, ..., and h81 to h8128) included in the row vectors R1 to R8 of the first H matrix H and 128-bit data (r1 to r128) of the 136×1 matrix and then perform a modulo 2 operation thereon to generate 8-bit parity P21 to P21.

That is, the 8-bit parity P21 to P28 may be expressed by the following equations.

$$P21=h11\hat{\ }r1+h12\hat{\ }r2+\ldots+h1128\hat{\ }r128$$

$$P22=h21\hat{\ }r1+h22\hat{\ }r2+\ldots+h2128\hat{\ }r128$$

. . .

$$P28=h81\hat{\ }r1+h82\hat{\ }r2+\ldots+h8128\hat{\ }r128$$

In the above equations, "^" denotes an XOR operator and "+" denotes a modulo 2 operator.

Figure 4:
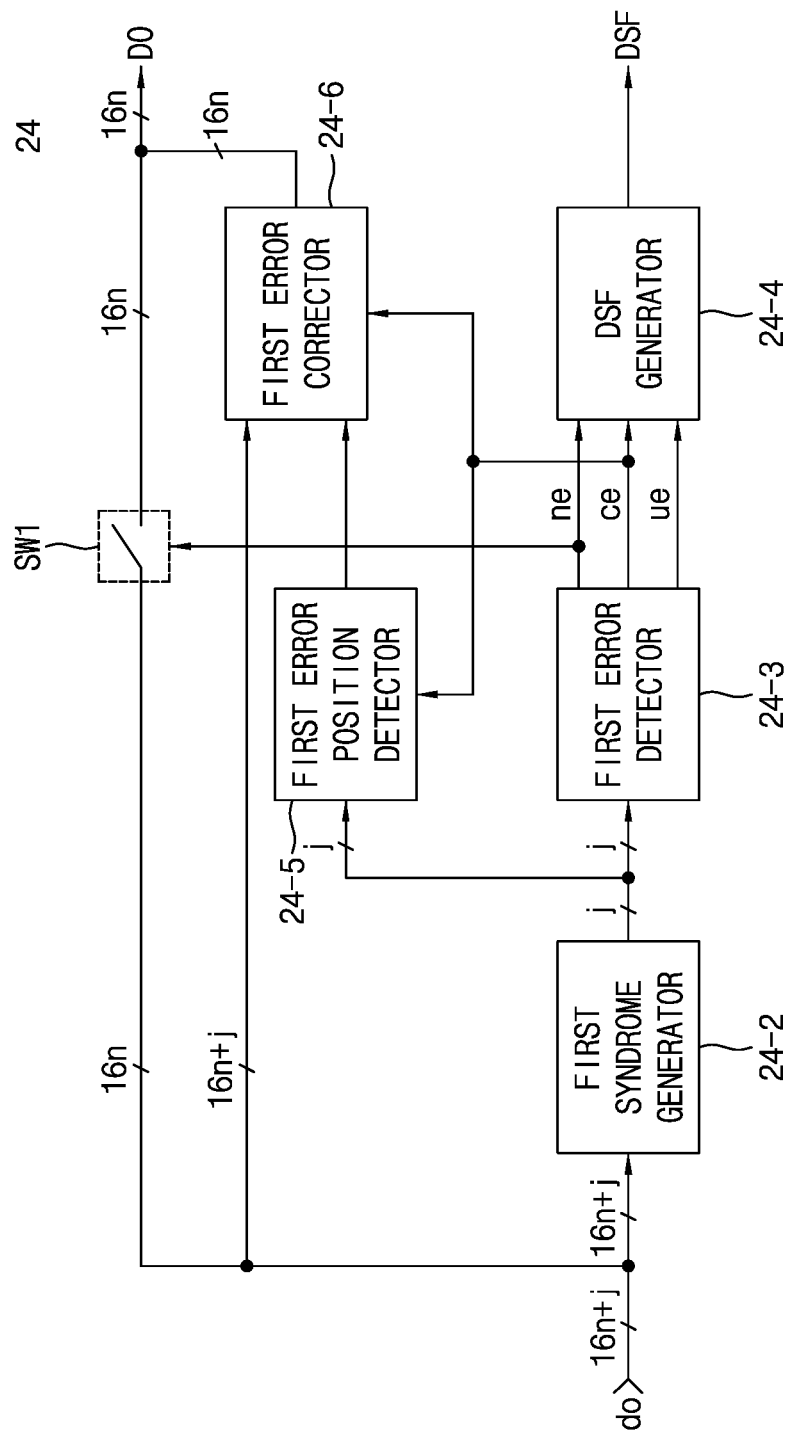
FIG. 4 is a diagram showing a configuration of an ECC decoder according to an example embodiment of the inventive concept.

FIG. 4 is a diagram showing a configuration of the first ECC decoder 24 according to the example embodiment of the inventive concept, and the first ECC decoder 24 may include a first syndrome generator 24-2, a first error detector 24-3, a DSF generator 24-4, a first error position detector 24-5, a first error corrector 24-6, and a first switch SW1.

A function of each of the blocks shown in FIG. 4 will be described as follows.

The first syndrome generator 24-2 may receive 16n-bit data and j-bit parity of the data do which are output from the memory cell array 20 to generate a j-bit syndrome. For example, each of n and j may be eight, and the first syndrome generator 24-2 may perform an XOR operation on each of row vectors of the first H matrix, that is, an 8×136 matrix, and a 136×1 matrix of 136-bit data, and then perform a modulo 2 operation thereon to generate an 8-bit syndrome.

FIG. 5 is a diagram for describing a syndrome operation of the first syndrome generator 24-2 according to the example embodiment of the inventive concept, which is for describing the syndrome operation in the case in which each of n and j is eight.

Referring to FIG. 5, a second H matrix H' may be an 8×136 matrix, and a matrix R' of 128-bit data and 8-bit parity of the data do may be a 136×1 matrix. Codes (h11' to h81', h12' to h82', ..., and h1136' to h8136') of 136 column vectors C1' to C136' may have different codes including "0" and "1" except for a code including all "0." In the second H matrix H', a total of $2^{128}$ different codes including the codes (h11' to h1128', h21' to h2128', ..., and h81' to h8128') of row vectors R1' to R8' may be generated, and the same or different 8-bit second parity for each of the $2^{128}$ codes in total may be generated. In this case, a minimum Hamming distance (dmin) between any two codes of the $2^{128}$ different 136-bit codes in total may be three. For example, the first ECC decoder 24 shown in FIG. 1 may perform a 1-bit error correction and 1-bit error detection operation.

Referring to FIGS. 4 and 5, the first syndrome generator 24-2 may perform an XOR operation on each of the codes (h11' to h1136', h21' to h2136', ..., and h81' to h8136') of the row vectors R1' to R8' of the second H matrix H' and a code (r1' to r128' and P1' to P8') of the 136×1 matrix and then perform a modulo 2 operation thereon to generate an 8-bit syndrome (S1 to S8).

That is, the 8-bit syndrome (S1 to S8) may be expressed by the following expressions.

$$S1=h11'\hat{\ }r1'+h12'\hat{\ }r2'+\ldots+h1128'\hat{\ }r128'+\ldots+h1136'\hat{\ }P8'$$

$$S2=h21'\hat{\ }r1'+h22'\hat{\ }r2'+\ldots+h2128'\hat{\ }r128'+\ldots+h2136'\hat{\ }P8'$$

. . .

$$S8=h81'\hat{\ }r1'+h82'\hat{\ }r2'+\ldots+h8128'\hat{\ }r128'+\ldots+h8136'\hat{\ }P8'$$

In the above expressions, "^" denotes an XOR operator and "+" denotes a modulo 2 operator.

Referring to FIG. 4, the first error detector 24-3 may generate a non-error signal ne indicating a non-error NE when the 8-bit syndrome (S1 to S8) is all "0," generate a correctable error signal ce indicating a correctable error CE as a 1-bit error when the 8-bit syndrome (S1 to S8) is included in the codes of the 136 column vectors C1' to C136' of the second H matrix H', or generate an uncorrectable error signal ue indicating an uncorrectable error UE when the 8-bit syndrome (S1 to S8) is not present in the codes of the 136 column vectors C1' to C136' of the second H matrix H'.

Referring to FIG. 4, the DSF generator 24-4 may generate a DSF of a first state, for example, a DSF of "0," when the non-error signal ne or the correctable error signal ce is generated and generate a DSF of a second state, for example, a DSF of "1," when the uncorrectable error signal ue is generated. For example, the DSF generator 24-4 may generate the DSF of "0," or "1" based on a type of error such as a non-error NE, a correctable error CE and an uncorrectable error UE. The DSF generator 24-4 may output the DSF of "0," or "1" to an external device (e.g., a controller 110 as shown in FIG. 6) outside of the semiconductor memory device 100 when the semiconductor memory device 100 performs a read operation. For example, the DSF generator 24-4 may output the DSF through one of data terminals (e.g., data pads or data pins) of data DQ with data or through a separate terminal (e.g., a pad or a pin) other than the data terminals.

Referring to FIG. 4, the first error position detector 24-5 may detect an error position by checking a position of the column vector, of which codes among the codes of the 136 column vectors C1' to C136' of the second H matrix H' match the 8-bit syndrome (S1 to S8) in response to the correctable error signal ce, and generate error position information. For example, the first error position detector 24-5 may generate the error position information indicating that there is an error at a first position when the 8-bit syndrome (S1 to S8) match the codes of a first column vector C1' of the second H matrix H'.

Referring to FIG. 4, the first error corrector 24-6 may correct an error of (16n+j)-bit data on the basis of the error position information. For example, the first error corrector 24-6 may correct the error by inverting a first bit r1' (shown in FIG. 5) of the code (r1' to r128' and P1' to P8') of the 136×1 matrix when the error position information indicates that the error is at the first position. The first error corrector 24-6 may generate 16n-bit data excluding a j-bit parity included in the corrected (16n+j)-bit data of the data do as the data DO.

Referring to FIG. 4, the first switch SW1 may be turned on in response to the non-error signal ne (or the uncorrectable error signal ue) to generate the 16n-bit data as the data DO.

FIG. 6 is a block diagram showing a memory system according to an example embodiment of the inventive concept, and a memory system 200 may include a semiconductor memory device 100 and a controller 110. The controller 110 may include a second ECC encoder 112, a second ECC decoder 114, and a data processing unit 116 (such as a micro-processor, a central processing unit CPU, etc.). In other example embodiments, the data processing unit 116 may be separate from the controller 110. For example, the memory system 200 may include the semiconductor memory device 100, the controller 110 and the data processing unit 116.

A function of each of the blocks shown in FIG. 6 will be described as follows.

The semiconductor memory device 100 may receive a command and address CA and data DQ from the controller 110, and output data DQ and a DSF to the controller 110. Unlike what is shown in the drawing, the DSF may be transmitted before, during, or after the transmission of the data DQ through one of data terminals (not shown) through which the data DQ is transmitted, rather than a separate terminal. For example, the DSF may be transmitted through a terminal (not shown) separated from the data terminals.

The controller 110 may output the command and address CA and the data DQ to the semiconductor memory device 100, and receive the data DQ and the DSF from the semiconductor memory device 100.

The second ECC encoder 112 may receive x-bit data DO' to generate y-bit parity of the x-bit data DO', and output 16n-bit data (wherein 16n=x+y). For example, the 16n-bit data may include the x-bit data DO' and the y-bit parity. For example, x may be 120, and y may be 8.

The second ECC decoder 114 may receive the data DQ of 16n-bit data and the DSF from the semiconductor memory device 100 to perform an ECC decoding operation selected from among a plurality of ECC decoding operations in response to the DSF, and generate data DI' and an error signal E. For example, the second ECC decoder 114 may perform a first ECC decoding operation when the DSF is "0" and perform a second ECC decoding operation when the DSF is "1."

In example embodiments, the first ECC decoding operation may be a 3-bit error detection operation and the second ECC decoding operation may be a 1-bit error correction and 2-bit error detection operation.

In example embodiments, the selected ECC decoding operation may be a p-bit error detection operation or q-bit error correction and (q+1)-bit error detection operation. Here, p is natural number equal to or greater than 4 and q is a natural number greater than 2.

The controller 110 may include an ECC engine (or, an ECC circuit) configured to perform an ECC decoding operation and an ECC encoding operation. The ECC engine may include the second ECC encoder 112 and the second ECC decoder 114. Each of the 3-bit error detection operation and the 1-bit error correction and 2-bit error detection operation may be referred to as a decoding rule of the ECC engine of the memory system 200.

The data processing unit 116 may generate the x-bit data DO' and receive the x-bit data DI' and the error signal E to perform a data processing operation for the x-bit data DI'.

When the first error detector 24-3 shown in FIG. 4 determines that the error is a 1-bit error and generates the correctable error signal ce, it means that the 1-bit error is substantially generated. However, in some cases, it means that a 2-bit error is substantially generated rather than the 1-bit error. For example, it is determined that the 1-bit error is generated because the j-bit syndrome matches the code of one column vector among the column vectors C1' to C136' of the second H matrix H', for example, the code of the first column vector. However, substantially, the error may be a 2-bit error which is generated by an XOR operation of the 8-bit syndrome (S1 to S8) and the codes of different two column vectors. Miscorrection in which the first error corrector 24-6 shown in FIG. 4 inverts the first bit r1' (shown in FIG. 5) of the 16n-bit data to correct the error may be performed. As a result, an error may be generated in 3 bits of the 16n-bit data and transmitted. The DSF generator 24-4 shown in FIG. 4 may transmit the DSF of "0." In this case, the second ECC decoder 114 shown in FIG. 6 may perform a 3-bit error detection operation to detect the miscorrection. Therefore, the second ECC decoder 114 may perform the 3-bit error detection operation to detect the miscorrection when the type of the error is the non-error NE or the correctable error CE and may perform the 1-bit error correction and 2-bit error detection operation to correct the 1-bit error when the type of the error is the uncorrectable error UE, and thus may selectively and efficiently perform the ECC decoding operation.

Figure 7:
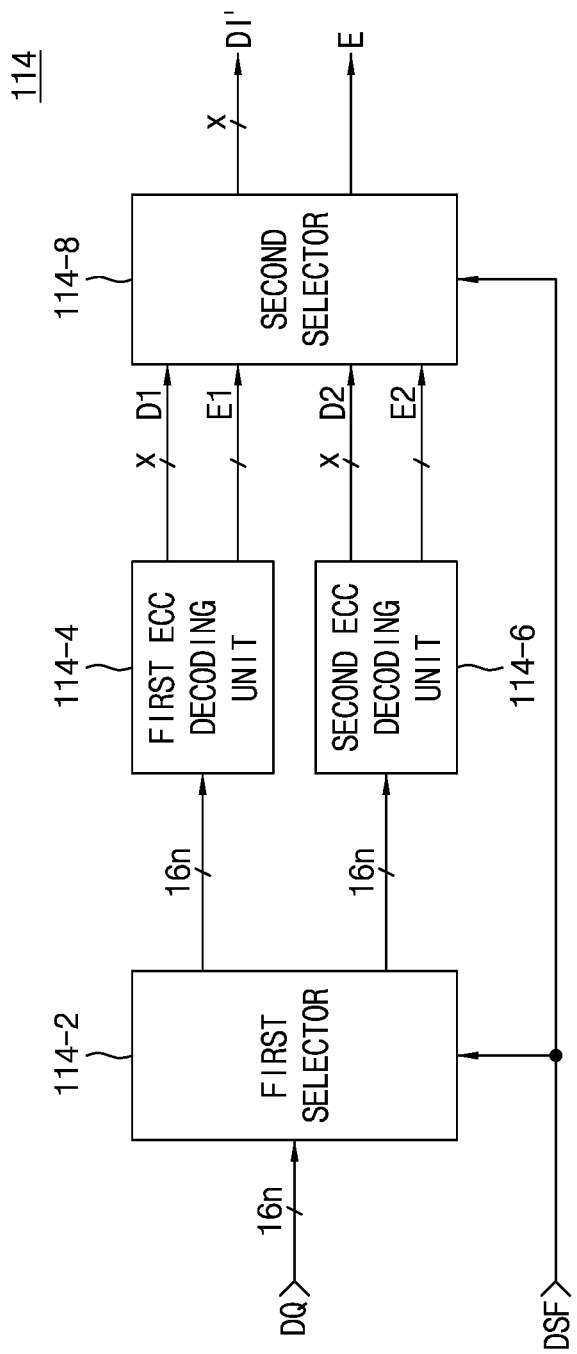
FIG. 7 is a block diagram showing a configuration of an ECC decoder according to an example embodiment of the inventive concept.

FIG. 7 is a block diagram showing a configuration of the second ECC decoder 114 according to the example embodiment of the inventive concept, and the second ECC decoder 114 may include a first selector 114-2, a first ECC decoding unit 114-4, a second ECC decoding unit 114-6, and a second selector 114-8.

A function of each of the blocks shown in FIG. 7 will be described as follows.

The first selector 114-2 may receive data DQ in response to a DSF to output the data DQ to the first ECC decoding unit 114-4 or the second ECC decoding unit 114-6. For example, the first selector 114-2 may output 16n-bit data to the first ECC decoding unit 114-4 when the DSF is "0" and output the 16n-bit data to the second ECC decoding unit 114-6 when the DSF is "1."

The first ECC decoding unit 114-4 may receive the 16n-bit data, perform a 3-bit error detection operation, and generate x-bit first data D1 and a first error signal E1.

The second ECC decoding unit 114-6 may receive the 16n-bit data, perform a 1-bit error correction and 2-bit error detection operation, and generate x-bit second data D2 and a second error signal E2.

In example embodiments, the second ECC decoder 114 may perform either a first ECC decoding operation by the first ECC decoding unit 114-4 or a second ECC decoding operation by the second ECC decoding unit 114-6 in response to the DSF. For example, the first ECC decoding unit 114-4 may perform the first ECC decoding operation in response to the DSF of "0," and the second ECC decoding unit 114-6 may perform the second ECC decoding operation in response to the DSF of "1." The second selector 114-8 may select the x-bit first data D1 and the first error signal E1 or the x-bit second data D2 and the second error signal E2, which are transmitted from the first ECC decoding unit 114-4 or the second ECC decoding unit 114-6, in response to the DSF, and output the x-bit first data D1 and the first error signal E1 or the x-bit second data D2 and the second error signal E2 as the x-bit data DI' and the error signal E. For example, the second selector 114-8 may select and transmit the x-bit first data D1 and the first error signal E1 when the DSF is "0" and select and transmit the x-bit second data D2 and the second error signal E2 when the DSF is "1."

In example embodiments, the second ECC decoder 114 may include the first ECC decoding unit 114-4, the second ECC decoding unit 114-6, and the second selector 114-8 without the first selector 114-2. In this case, the first ECC decoding unit 114-4 and the second ECC decoding unit 114-6 may receive the same 16n-bit data and perform the 3-bit error detection operation and the 1-bit error correction and 2-bit error detection operation, respectively, in response to the DSF.

In example embodiments, the second ECC decoder 114 may include three or more ECC decoding units each configured to perform one of the three or more ECC decoding operations based on the DSF. In this case, a number of bits of the DSF may be 2 bits or more bits.

Figure 8:
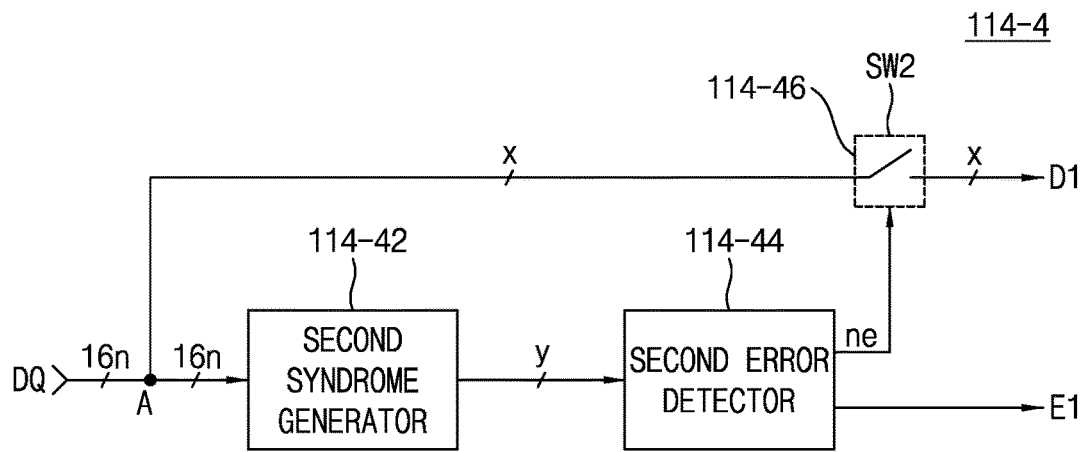
FIG. 8 is a diagram showing a first ECC decoding unit according to an example embodiment of the inventive concept.

FIG. 8 is a diagram showing the first ECC decoding unit 114-4 according to the example embodiment of the inventive concept, and the first ECC decoding unit 114-4 may include a second syndrome generator 114-42, a second error detector 114-44, and a second switch SW2.

A function of each of the blocks shown in FIG. 8 will be described as follows.

The second syndrome generator 114-42 may receive 16n-bit data DQ to generate a y-bit syndrome for the 16n-bit data DQ. Each of n and y may be eight, and the second syndrome generator 114-42 may perform an XOR operation on each of the row vectors of the third H matrix, that is, an 8×128 matrix, and a 128×1 matrix of 128-bit data, and then perform a modulo 2 operation thereon to generate an 8-bit syndrome.

Figure 9:
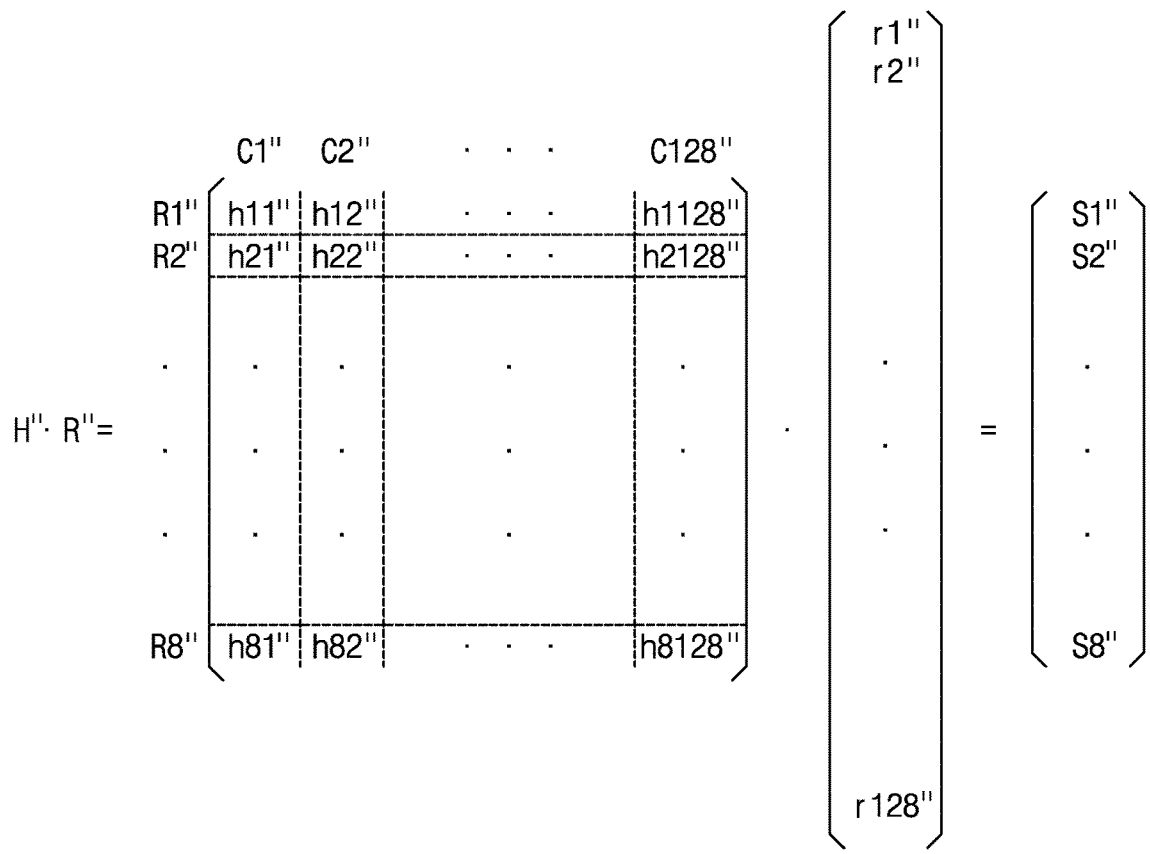
FIG. 9 is a diagram for describing a syndrome operation of a second syndrome generator according to an example embodiment of the inventive concept.

FIG. 9 is a diagram for describing a syndrome operation of the second syndrome generator 114-42 according to the example embodiment of the inventive concept, which is for describing the syndrome operation in the case in which each of n and y is eight.

A third H matrix H" may be an 8×128 matrix, and a matrix R" of the 16n-bit data DQ may be a 128×1 matrix. Codes (h11" to h81", h12" to h82", . . . , and h1128" to h8128") of 128 column vectors C1" to C128" may have different codes including "0" and "1" except for a code including all "0." The codes (h81" to h8128") of the last row vector R8" among the row vectors R1" to R8" of the third H matrix H" may be all "1." Further, in the third H matrix H", a total of $2^{120}$ different codes including codes corresponding to 120-bit data except for an 8-bit parity among the codes of the row vectors R1" to R8" may be generated, and the same or different 8-bit second parity for each of the $2^{120}$ codes in total may be generated. In this case, a minimum Hamming distance (dmin) between any two codes of the $2^{120}$ different 128-bit codes in total may be four.

Referring to FIGS. 8 and 9, the second syndrome generator 114-42 may perform an XOR operation on each of the codes (h11" to h1128", h21" to h2128", . . . , and h81" to h8128") of the row vectors R1" to R8" of the third H matrix H" and the codes (r1" to r128") of the 128×1 matrix and then perform a modulo 2 operation thereon to generate an 8-bit syndrome (S1" to S8").

That is, the 8-bit syndrome (S1" to S8") may be expressed by the following expressions.

$S1"=h11"\char`\^r1"+h12"\char`\^r2"+ \ldots +h1128"\char`\^r128"$ $S2"=h21"\char`\^r1"+h22"\char`\^r2"+ \ldots +h2128"\char`\^r128"$ $S8"=h81"\char`\^r1"+h82"\char`\^r2"+ \ldots +h8128"\char`\^r128"$ In the above expressions, "^" denotes an XOR operator and "+" denotes a modulo 2 operator.

Referring to FIG. 8, the second error detector 114-44 may generate a non-error signal ne indicating a non-error NE when the 8-bit syndrome (S1" to S8") is all "0" and detect a 3-bit or less error including a 1-bit error, a 2-bit error, or a 3-bit error when the 8-bit syndrome (S1" to S8") is included in the codes of 128 column vectors C1" to C128" of the third H matrix H" to generate a first error signal E1.

The second syndrome generator 114-42 and the second error detector 114-44 may operate when the DSF is "0."

Referring to FIG. 8, the second switch SW2 may be turned on in response to the non-error signal ne to generate x-bit data as first data D1 except for the y-bit parity included in the 16n-bit data DQ. Although not shown, when the first error signal E1 is generated, the second switch SW2 may be configured to either transmit or not transmit the x-bit data DQ.

Although not shown, the first ECC decoding unit 114-4 may include a switch SW2-1 disposed at node A. For example, the switch SW2-1 may be turned on in response to the DSF of "0" to electrically connect the 16n-bit data DQ to the second switch SW2 and the second syndrome generator 114-42. In this case, x-bit data of the 16n-bit data DQ may be connected to the second switch SW2.

Figure 10:
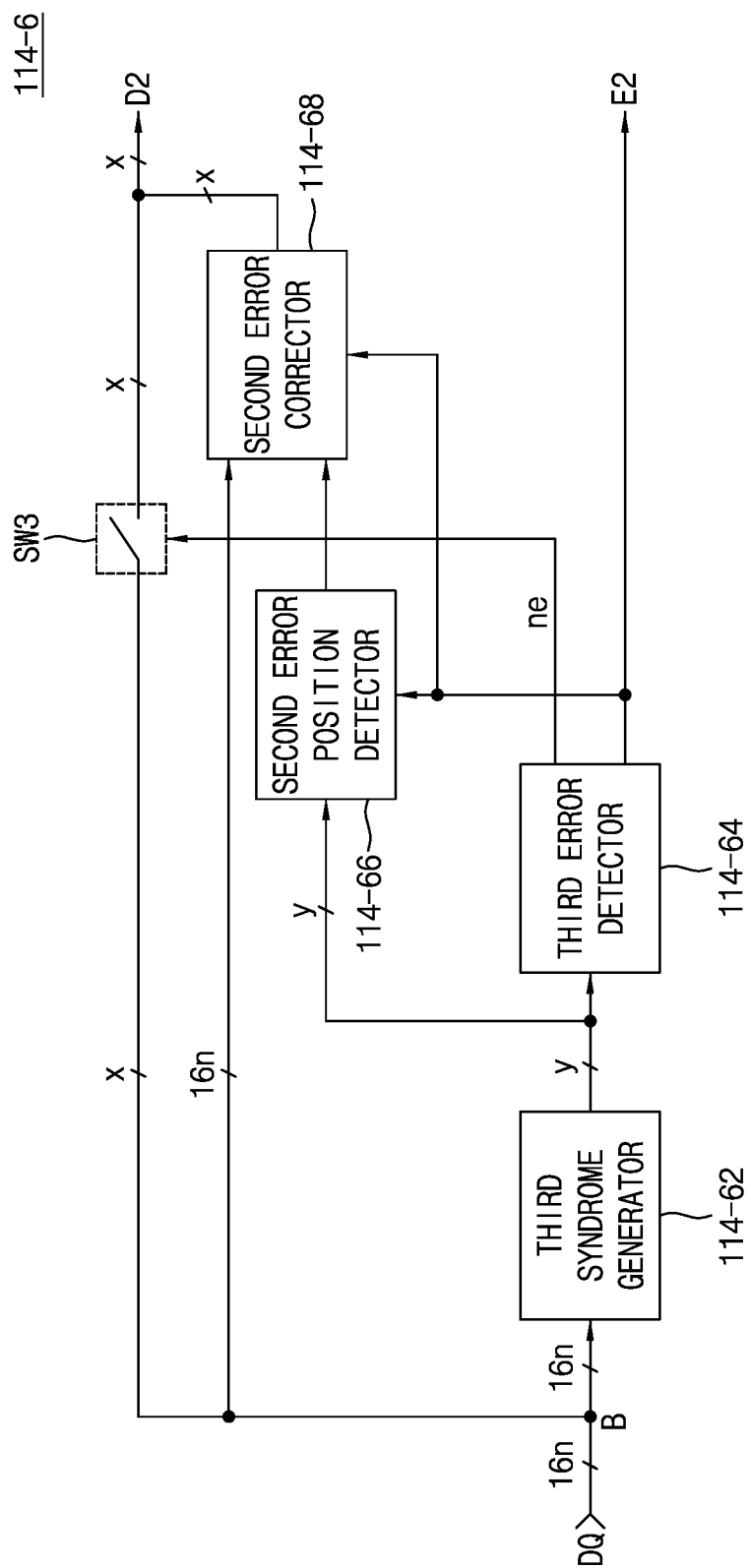
FIG. 10 is a diagram showing a second ECC decoding unit according to an example embodiment of the inventive concept.

FIG. 10 is a diagram showing the second ECC decoding unit 114-6 according to the example embodiment of the inventive concept, and the second ECC decoding unit 114-6 may include a third syndrome generator 114-62, a third error detector 114-64, a second error position detector 114-66, a second error corrector 114-68, and a third switch SW3.

A function of each of the blocks shown in FIG. 10 will be described as follows.

The third syndrome generator 114-62 may perform the same operation as that of the second syndrome generator 114-42 shown in FIG. 8 to generate the y-bit syndrome of the 16n-bit data DQ.

The third error detector 114-64 may generate a non-error signal ne indicating a non-error NE when the 8-bit syndrome (S1" to S8") is all "0" or detect a 2-bit or less error including a 1-bit error or a 2-bit error when the 8-bit syndrome (S1" to S8") is included in the codes of the 128 column vectors C1" to C128" of the third H matrix H" to generate a second error signal E2.

The second error position detector 114-66 may detect an error position by checking a position of the column vector of which codes among the codes of the column vectors C1" to C128" of the third H matrix H" match the 8-bit syndrome (S1" to S8") in response to the second error signal E2 and generate error position information. For example, the second error position detector 114-66 may generate the error position information indicating that there is an error at a first position when the 8-bit syndrome (S1" to S8") matches the code of a first column vector C1" of the third H matrix H".

The second error corrector 114-68 may correct an error of 16n-bit data DQ on the basis of the error position information to generate second data D2. For example, the second error corrector 114-68 may correct the error by inverting a first bit r1" (shown in FIG. 9) of the 16n-bit data DQ when the error position information indicates that the error is at the first position and generate x-bit data excluding a y-bit parity included in the 16n-bit data DQ as the second data D2.

The third switch SW3 may be turned on in response to the non-error signal ne to transmit the x-bit data excluding the y-bit parity included in the 16n-bit data DQ as the second data D2.

Although not shown, the second ECC decoding unit 114-6 may include a switch SW3-1 disposed at node B. For example, the switch SW3-1 may be turned on in response to the DSF to electrically connect x-bit data of the 16n-bit data DQ to the third switch SW3 and the 16n-bit data to the second error corrector 114-68 and the third syndrome generator 114-62.

Figure 11:
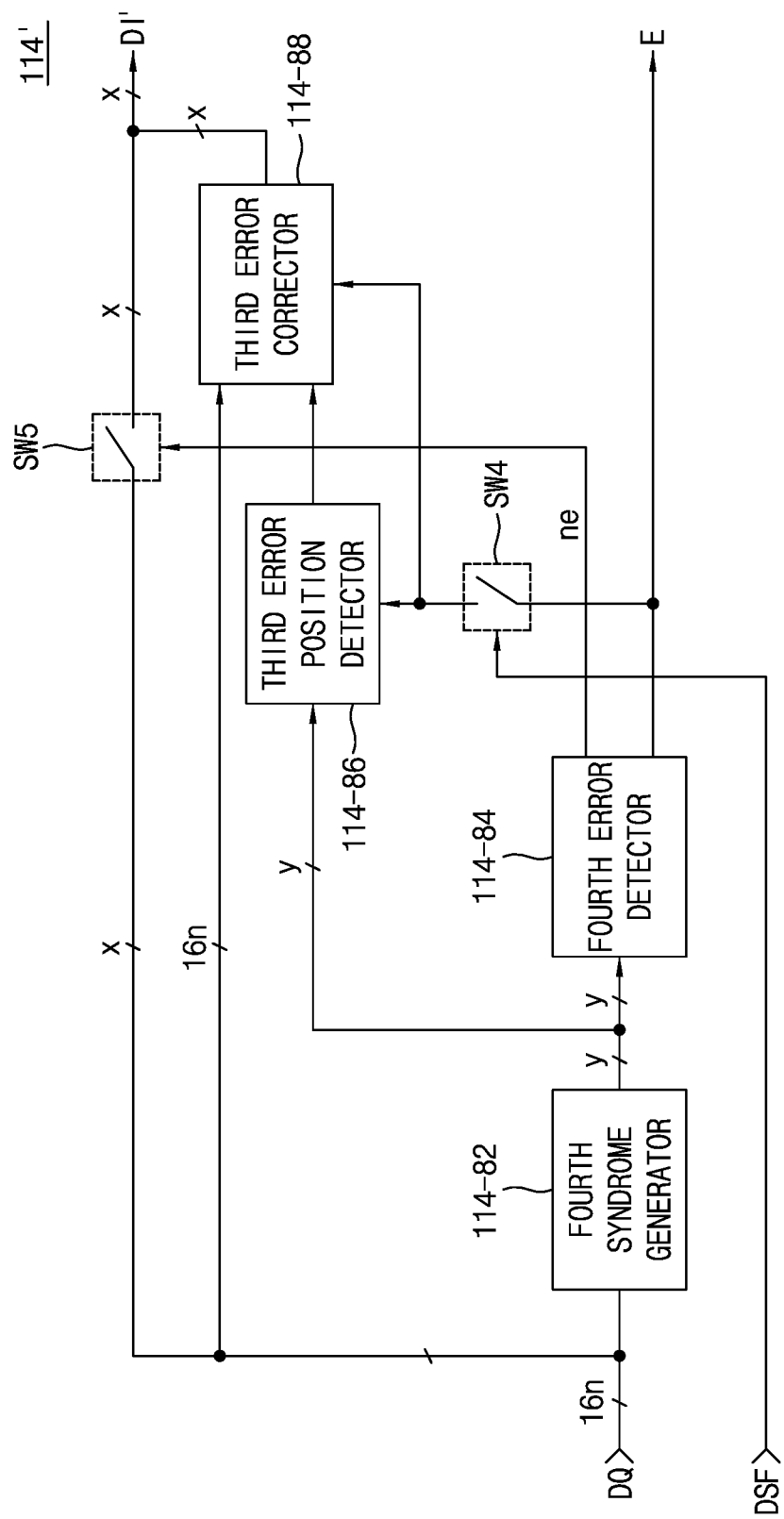
FIG. 11 is a block diagram showing a configuration of an ECC decoder according to an example embodiment of the inventive concept.

FIG. 11 is a block diagram showing a configuration of a second ECC decoder 114' according to other example embodiments of the inventive concept, and the second ECC decoder 114' may include a fourth syndrome generator 114-82, a fourth error detector 114-84, a third error position detector 114-86, a third error corrector 114-88, a fourth switch SW4, and a fifth switch SW5.

A function of each of the blocks shown in FIG. 11 will be described as follows.

The fourth syndrome generator 114-82 and the fourth error detector 114-84 may perform the same operations as those of the second syndrome generator 114-42 and the second error detector 114-44 shown in FIG. 8, respectively.

The fourth switch SW4 may be turned on when the DSF is "1" to transmit an error signal E.

The third error position detector 114-86 may perform the same operation as that of the second error position detector 114-66 shown in FIG. 10 in response to the error signal E transmitted through the fourth switch SW4.

The third error corrector 114-88 may perform the same operation as that of the second error corrector 114-68 shown in FIG. 10 in response to the error signal E transmitted through the fourth switch SW4.

The fifth switch SW5 may be turned on in response to the non-error signal ne to generate x-bit data excluding the y-bit parity included in the 16n-bit data DQ as data DI.

Unlike the second ECC decoder 114 shown in FIG. 7, in the second ECC decoder 114' shown in FIG. 11, the fourth syndrome generator 114-82 and the fourth error detector 114-84 may perform a common operation when the DSF is "0" and "1." Therefore, the second ECC decoder 114' shown in FIG. 11 may be simplified in circuit configuration as compared to the second ECC decoder 114 shown in FIGS. 7, 8, and 10.

In the above-described example embodiments, the 16n bits may be represented by m bits (m being a natural number greater than 2). Further, in the above-described example embodiments, the DSF generator 24-4 shown in FIG. 4 is described as generating the DSF of "0" when the non-error signal ne or the correctable error signal ce is generated and is described as generating the DSF of "1" when the uncorrectable error signal ue is generated. However, as an example, the DSF generator 24-4 may generate the DSF of "0" when the non-error signal ne is generated and generate the DSF of "1" when the correctable error signal ce or the uncorrectable error signal ue is generated. In this case, the DSF generator 24-4 may generate the DSF of "0" instead of the DSF of "1" or generate the DSF of "1" instead of the DSF of "0." In addition, as an example, the DSF may be two bits or more rather than one bit. When the DSF is two bits, the DSF generator 24-4 shown in FIG. 4 may generate three different 2-bit DSF, respectively, from among "00," "01," "10," and "11" when the non-error signal ne, the correctable error signal ce, and the uncorrectable error signal ue are generated.

According to the example embodiments of the inventive concept, the semiconductor memory device can generate a decoding status flag according to a type of an error, and a controller can perform a different ECC decoding operation on the basis of the decoding status flag. Therefore, the memory system can efficiently perform an ECC decoding operation and thus reliability can be improved.

While the embodiments of the inventive concept have been described with reference to the accompanying drawings, it should be understood by those skilled in the art that various modifications may be made without departing from the scope of the inventive concept and without changing essential features thereof. Therefore, all such modifications are intended to be included within the scope of the present inventive concept as defined in the claims.

What is claimed is:

1. A semiconductor memory device comprising:
   a row decoder configured to decode a row address to generate a word line selection signal;
   a column decoder configured to decode a column address to generate a column selection signal;
   a memory cell array comprising a plurality of memory cells, one or more memory cells selected in response to the word line selection signal and the column selection signal; and
   an error correcting code (ECC) decoder configured to receive first data and a parity output from the selected memory cells of the memory cell array and generate a syndrome based on the first data and the parity, and in response to a read operation of the semiconductor memory device being performed, to generate second data and a decoding status flag (DSF) indicating a type of an error of the first data by the syndrome and to output the second data and the DSF to an external device outside of the semiconductor memory device,
   wherein a number of bits of the first data is the same as a number of bits of the second data.

2. The semiconductor memory device of claim 1, further comprising:
   an ECC encoder configured to receive third data from the external device, to generate the parity, and to output fourth data and the parity to the selected memory cells when a write operation of the semiconductor memory device is performed,
   wherein a number of bits of the third data is the same as a number of bits of the fourth data.

3. The semiconductor memory device of claim 2, wherein the ECC encoder includes a parity generator configured to perform an exclusive OR (XOR) operation on each of row vectors of a first H matrix and on the third data and then perform a modulo 2 operation thereon to generate the parity, and
   wherein codes of column vectors of the first H matrix have different codes including "0" and "1," that are not all "0," and a minimum Hamming distance between the codes of the first H matrix is three.

4. The semiconductor memory device of claim 1, wherein the ECC decoder is configured to:
   output the first data as the second data when the syndrome indicates a non-error, correct a corresponding bit of the first data and the parity and then output the corrected data as the second data when the syndrome indicates a correctable error, and
   generate the DSF having a first state when the syndrome indicates the non-error or the correctable error and a second state when the syndrome indicates an uncorrectable error.

5. The semiconductor memory device of claim 4, wherein the second data and the DSF are output to the outside of the semiconductor memory device in series or in parallel when the read operation is performed.

6. The semiconductor memory device of claim 1, wherein the ECC decoder includes:
   a syndrome generator configured to perform an XOR operation on each of row vectors of a second H matrix, and the first data and the parity and then perform a modulo 2 operation thereon to generate a predetermined number of bits of syndrome;
   an error detector configured to detect a non-error, a correctable error, or an uncorrectable error using the syndrome;

an error position detector configured to detect a position of column vector of the second H matrix in which the syndrome is present to generate error position information when the correctable error is detected;
an error corrector configured to correct errors of the first data and the parity on the basis of the error position information when the correctable error is detected; and
a DSF generator configured to generate the DSF of a first state when the non-error or the correctable error is detected and generate the DSF of a second state when the uncorrectable error is detected.

7. The semiconductor memory device of claim 6, wherein codes of column vectors of the second H matrix have different codes including "0" and "1," that are not all "0," and a minimum Hamming distance between the codes of the second H matrix is three.

8. A controller comprising:
an error correcting code (ECC) decoder configured to:
perform an ECC decoding operation selected from among a plurality of ECC decoding operations on first data applied from an external device outside of the controller in response to a decoding status flag (DSF) applied from the external device and indicating a type of an error of the first data, and
generate second data and an error signal by performing the selected ECC decoding operation,
wherein the first data and the DSF are provided from an outside of the controller, and
wherein a number of bits of the first data is the same as a number of bits of the second data.

9. The controller of claim 8, wherein the ECC decoder comprises:
a first ECC decoding unit configured to perform a first ECC decoding operation in response to the DSF of a first state; and
a second ECC decoding unit configured to perform a second ECC decoding operation in response to the DSF of a second state,
wherein the first ECC decoding operation is an error detection operation, and
wherein the second ECC decoding operation is an error correction and detection operation.

10. The controller of claim 9, wherein the first ECC decoding unit is configured to receive the first data, to generate a first predetermined number of bits of first syndrome, and detect that the first syndrome indicates a non-error or a 3-bit or less error,
wherein the second ECC decoding unit is configured to receive the first data, to generate the first predetermined number of bits of second syndrome, and to detect that the second syndrome indicates a non-error or a 2-bit or less error,
wherein, when the second syndrome indicates the non-error, the second ECC decoding unit transmits data excluding a parity with a predetermined number of bits included in the first data, and
wherein, when the second syndrome indicates the 2-bit or less error, the second ECC decoding unit detects an error position of the first data to generate error position information using the second syndrome, corrects an error of the first data using the error position information, and then transmits corrected data excluding the parity.

11. The controller of claim 10, wherein the first ECC decoding unit comprises:
a first syndrome generator configured to perform an exclusive OR (XOR) operation on each of row vectors of a first H matrix and the first data and then perform a modulo 2 operation thereon to generate the first syndrome; and
a first error detector configured to detect the non-error or the 3-bit or less error using the first syndrome.

12. The controller of claim 11, wherein the second ECC decoding unit comprises:
a second syndrome generator configured to perform an XOR operation on each of row vectors of a second H matrix and the first data and then perform a modulo 2 operation thereon to generate the first predetermined number of bits of second syndrome;
a second error detector configured to detect the non-error or the 2-bit or less error using the second syndrome;
an error position detector configured to detect a position of column vector of the second H matrix in which the second syndrome is present to generate error position information when the 2-bit or less error is detected; and
an error corrector configured to correct an error of the first data on the basis of the error position information when the 2-bit or less error is detected.

13. The controller of claim 12, wherein codes of column vectors of the first H matrix and the second H matrix have different codes including "0" and "1," that are not all "0," and a minimum Hamming distance between the codes of the first H matrix and a minimum Hamming distance between the codes of the second H matrix are four.

14. The controller of claim 8, wherein the ECC decoder comprises:
a syndrome generator configured to perform an exclusive OR (XOR) operation on each of row vectors of an H matrix and the first data and then perform a modulo 2 operation thereon to generate a predetermined number of bits of syndrome;
an error detector configured to detect a non-error or a 3-bit or less error using the syndrome;
an error position detector configured to detect a position of column vector of the H matrix in which the syndrome is present to generate error position information when the 3-bit or less error is detected in response to the DSF; and
an error corrector configured to correct an error of the first data on the basis of the error position information when the 3-bit or less error is detected in response to the DSF.

15. The controller of claim 8, further comprising:
a data processing unit configured to perform a data processing operation by receiving the second data and the error signal.

16. A memory system comprising:
a semiconductor memory device comprising:
a row decoder configured to decode a row address to generate a word line selection signal;
a column decoder configured to decode a column address to generate a column selection signal;
a memory cell array comprising a plurality of memory cells, one or more memory cells are selected in response to the word line selection signal and the column selection signal; and
a first error correcting code (ECC) decoder configured to:
perform a first ECC decoding operation by receiving first data and a parity output from selected memory cells of the memory cell array,
generate a syndrome based on the first data and the parity,
generate second data by performing the first ECC decoding operation, and generate a decoding status flag (DSF) indicating a type of an error of the first data by the syndrome when a read operation of the semiconductor memory device is performed; and a controller configured to control the semiconductor memory device, the controller comprising:

a second ECC decoder configured to perform an ECC decoding operation selected from among a plurality of ECC decoding operations on the second data applied from the semiconductor memory device in response to the DSF applied from the semiconductor memory device.

17. The memory system of claim 16, wherein the first ECC decoder outputs the first data as the second data when the syndrome indicates a non-error, when the syndrome indicates a correctable error, corrects a corresponding bit of the first data and the parity and then outputs the corrected data, and generates the DSF having a first state when the syndrome indicates the non-error or the correctable error and a second state when the syndrome indicates an uncorrectable error.

18. The memory system of claim 17, wherein the semiconductor memory device outputs the second data and the DSF to the controller in series or in parallel when the read operation is performed.

19. The memory system of claim 18, wherein the second ECC decoder comprises:

a syndrome generator configured to perform an exclusive OR (XOR) operation on each of row vectors of an H matrix and the second data and then perform a modulo 2 operation thereon to generate a predetermined number of bits of syndrome;

an error detector configured to detect the non-error or a 3-bit or less error using the syndrome;

an error position detector configured to detect a position of column vector of the H matrix in which the syndrome is present to generate error position information when a 3-bit or less error is detected in response to the DSF; and an error corrector configured to correct an error of the second data on the basis of the error position information in response to the DSF when the 3-bit or less error is detected, wherein codes of column vectors of the H matrix have different codes including "0" and "1," that are not all "0," and a minimum Hamming distance between the codes of the H matrix is three.

20. The memory system of claim 16, wherein the second ECC decoder comprises:

a first ECC decoding unit configured to perform a second ECC decoding operation in response to the DSF of a first state; and a second ECC decoding unit configured to perform a third ECC decoding operation in response to the DSF of a second state, wherein the second ECC decoding operation is an error detection operation, and wherein the third ECC decoding operation is an error correction and detection operation.

* * * * *